United States Patent [19]

Ochi

[11] Patent Number: 5,500,616
[45] Date of Patent: Mar. 19, 1996

[54] OVERVOLTAGE CLAMP AND DESATURATION DETECTION CIRCUIT

[75] Inventor: Sam S. Ochi, Cupertino, Calif.

[73] Assignee: IXYS Corporation, Santa Clara, Calif.

[21] Appl. No.: 372,638

[22] Filed: Jan. 13, 1995

[51] Int. Cl.$^6$ .............................. H03K 17/08; H02H 3/26
[52] U.S. Cl. .......................... 327/310; 327/422; 327/427; 327/502; 327/380; 361/18; 361/91
[58] Field of Search ..................................... 327/309, 310, 327/312, 313, 314, 381, 380, 502, 375, 376, 374, 326, 327, 328, 379, 421, 422, 427, 432, 434, 438; 361/18, 86, 91

[56] References Cited

U.S. PATENT DOCUMENTS

| 4,423,457 | 12/1983 | Brajder ........................................ 361/86 |
| 4,658,203 | 4/1987 | Freymuth .................................... 361/91 |
| 4,890,185 | 12/1989 | Karl et al. .................................. 361/91 |
| 5,001,373 | 3/1991 | Bator et al. ............................... 327/314 |
| 5,304,935 | 4/1994 | Rathke et al. ........................... 361/101 |

OTHER PUBLICATIONS

Yamazaki, T., et al., "The IGBT with Monolithic Overvoltage Protection Circuit," *Proceedings of the 5th International Symposium on Power Semiconductor Devices and ICs* (1993), pp. 41–45.

*Primary Examiner*—Timothy P. Callahan
*Assistant Examiner*—Terry L. Englund
*Attorney, Agent, or Firm*—Townsend and Townsend and Crew

[57] ABSTRACT

An apparatus for suppressing voltage transients and detecting desaturation conditions in power transistor systems. A first transistor, usually a power transistor, has a first terminal, a second terminal, a drive terminal, and an avalanche breakdown voltage rating between the first and second terminals. The cathode of a first diode is coupled to the first terminal of the first transistor. The first diode has a reverse breakdown voltage which is less than the avalanche breakdown voltage rating of the first transistor. The anode of a second diode is coupled to the anode of the first diode, and the cathode of the second diode is coupled to the drive terminal of the first transistor. Driver circuitry is also coupled to the drive terminal, and provides a drive signal to the first transistor. An RC network comprising a first resistor and a first capacitor is coupled to the driver circuitry. The base terminal of a second transistor is coupled to the driver circuitry by means of the RC network. The cathode of a third diode is coupled to the emitter of the second transistor and the anodes of the first and second diodes. The third diode has a reverse breakdown voltage rating. The anode of the third diode is coupled to ground. A comparator circuit coupled to the anode of the third diode senses desaturation conditions of the first transistor.

26 Claims, 1 Drawing Sheet

OVERVOLTAGE CLAMP AND
DESATURATION DETECTION CIRCUIT

BACKGROUND OF THE INVENTION

This invention relates to a circuit which combines a desaturation detector and a breakdown voltage clamp for use with power transistors.

Desaturation detection circuits with fast response times and precise detection thresholds are desirable for systems employing power transistors to protect the power transistors from excess current, for example, from a load short circuit. During the initial turn on of a power transistor, however, desaturation detection circuitry must be disabled for a time sufficient to allow the transistor to reach saturation. In the past, this problem has been solved by using detection circuits with response times greater than the time it takes for the power transistor to initially reach saturation. Unfortunately, such slow response times often provide inadequate protection during normal operation. In addition to being too slow, previous desaturation detection circuits often had imprecise detection thresholds due to system component tolerances. This had the effect of further undermining reliable sensing of desaturation events.

Another problem facing power systems is the occurrence of overvoltages across the power transistors. Previous solutions to the overvoltage problem have employed snubber circuits. While snubber circuits have been shown to provide adequate protection against overvoltage conditions, they require the use of high quality, high voltage capacitors which are bulky and expensive.

Thus, there is a need for a desaturation detection circuit with a fast response time and a precise detection threshold. There is also a need for overvoltage clamp protection which eliminates the need for snubber circuits.

SUMMARY OF THE INVENTION

The present invention provides an apparatus for suppressing voltage transients and detecting desaturation conditions in systems employing power transistors. A single circuit performs these two functions, certain circuit components being used to implement both. The suppression of voltage transients is essentially achieved by means of a zener diode coupled between the high voltage and drive terminals of the system's power transistor. When an overvoltage condition occurs across the power transistor, the zener breaks down, feeding the voltage increase back to the drive terminal of the power transistor. This turns the transistor on and allows it to sink current, thereby slowing down the increase in voltage across the transistor and counteracting the overvoltage.

Under normal operating conditions, a combination of several components (including the zener diode) are employed to set a voltage level at the input of a comparator which indicates a proper saturation voltage across the power transistor. A first RC network creates a delay (approximately 10 μs) at circuit power-up during which the desaturation detection circuit is disabled. A second RC network governs the time in which the circuit responds to a desaturation condition (approximately 1 μs). When the power transistor comes out of saturation, the voltage level at the input to the comparator drops below a reference level, and the transistor is turned off.

More specifically, a first transistor, usually a power transistor, has a first terminal, a second terminal, a drive terminal, and an avalanche breakdown voltage rating between the first and second terminals. The cathode of a first diode is coupled to the first terminal of the first transistor. The first diode has a reverse breakdown voltage which is less than the avalanche breakdown voltage rating of the first transistor. The anode of a second diode is coupled to the anode of the first diode, and the cathode of the second diode is coupled to the drive terminal of the first transistor. Driver circuitry is also coupled to the drive terminal, and provides a drive signal to the first transistor. An RC network comprising a first resistor and a first capacitor is coupled to the driver circuitry. The base terminal of a second transistor is coupled to the driver circuitry by means of the RC network. The cathode of a third diode is coupled to the emitter of the second transistor and the anodes of the first and second diodes. The third diode has a reverse breakdown voltage rating. The anode of the third diode is coupled to ground. A comparator circuit coupled to the anode of the third diode senses desaturation conditions of the first transistor.

In one embodiment, the reverse breakdown voltage of the first diode is $0.9*V_B$, where $V_B$ is the avalanche breakdown voltage rating between the first and second terminals of the first transistor. In another embodiment, the driver circuitry and the comparator circuit are fabricated in an integrated circuit. In still another embodiment, the first transistor and the first diode are fabricated on the same semiconductor substrate.

In one embodiment, the RC network formed by the first resistor and the first capacitor determines the delay in the enabling of the apparatus. A second RC network coupled to the anode of the third diode determines the time in which the apparatus responds to a desaturation condition, and the time in which the desaturation circuit is able to reset itself once the desaturation condition has dissipated.

The invention has the advantage of providing a desaturation circuit with a fast response time and a precise detection threshold. Another advantage presented by the invention is fast overvoltage protection without the need for expensive, bulky snubber circuits.

A further understanding of the nature and advantages of the present invention may be realized by reference to the remaining portions of the specification and the drawings.

DESCRIPTION OF THE SPECIFIC EMBODIMENTS

Figure 1:
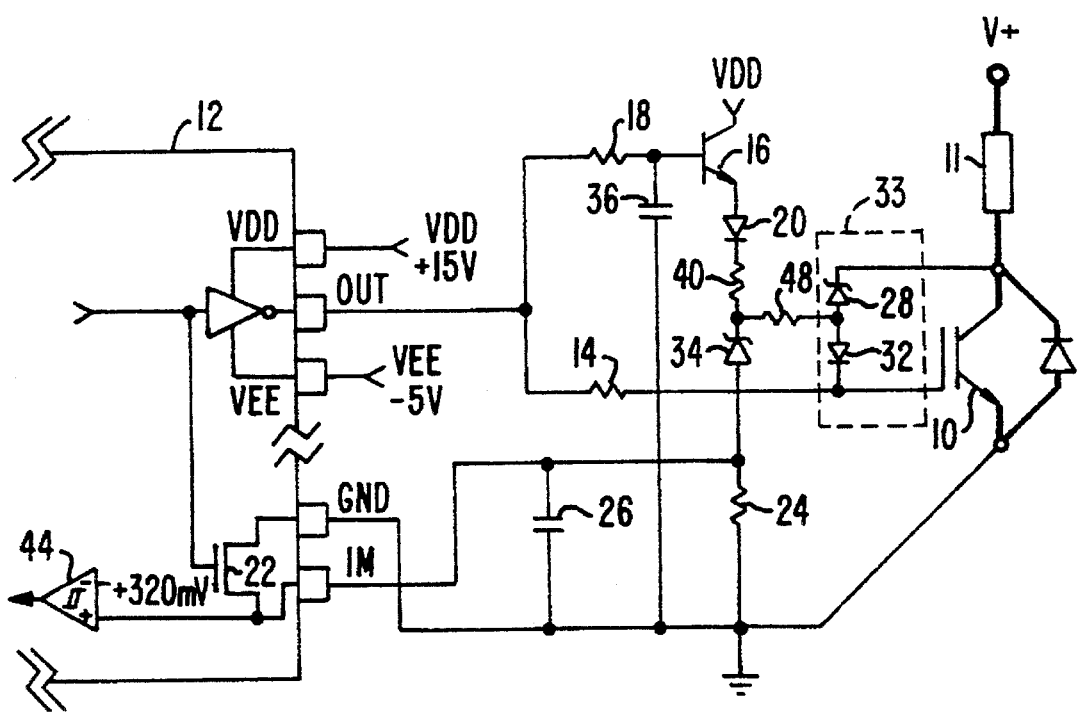
FIG. 1 is a schematic diagram of one embodiment of the combination overvoltage clamp and desaturation detection circuit.

FIG. 1 is a schematic diagram of one embodiment of the combination overvoltage clamp and desaturation detection circuit. The circuit shown may be employed, for example, in a power module in which output power transistor 10 is one of two power transistors in a half-bridge inverter configuration. One such power module is described in a commonly assigned and copending U.S. patent application, Ser. No. 08/372,525, for INTELLIGENT, ISOLATED HALF-BRIDGE POWER MODULE, filed on 13 January 1995. In such a power module, integrated circuit (IC) 12 receives a transformer coupled input signal from low voltage electronics which may be directly coupled to a pulse width modulator (not shown). IC 12 then provides a drive signal to transistor 10 which amplifies the signal, providing a drive signal for load 11. It will be understood that the invention can be practiced with other types of power transistors, including metal oxide semiconductor field effect transistors (MOSFETs), insulated gate bipolar transistors (IGBTs), MOS controlled thyristors (MCTs), and bipolar transistors.

When output power transistor 10 is off, the OUT terminal of IC 12 keeps transistor 10 off by applying a negative bias (with respect to its source potential), $V_{EE}$, to the gate of transistor 10 through resistor 14, the series gate resistor. IC 12 also drives the base of transistor 16 to $V_{EE}$ through resistor 18 so that its base to emitter junction is reverse biased and off. Diode 20 prevents the base-emitter junction of transistor 16 from zenering during this period. FET 22 which is internal to integrated circuit 12, shorts resistor 24 and capacitor 26 to ground. The clamp avalanche diode 28 has a reverse breakdown voltage of $0.9*V_B$, where $V_B$ is the avalanche breakdown voltage rating of transistor 10. In the event of an overvoltage at the drain of transistor 10, as soon as the drain potential reaches $0.9*V_B$, diode 28 breaks down and starts conducting. The current through diode 28 charges the input capacitance of transistor 10, thereby driving up the gate to source voltage of transistor 10 ($V_{GS10}$). As the drain to source voltage of transistor 10 ($V_{DS10}$) continues to climb, $V_{GS10}$ begins rising at the same rate. Soon the $V_{GS10}$ is sufficiently high to overcome the input threshold and transistor 10 starts to conduct current. As $V_{DS10}$ continues to climb, $V_{GS10}$ also continues to become more positive. As long as $V_{DS10}$ does not exceed $V_B$, transistor 10 can conduct a full short circuit current of at least 5 times its rated current at 90° C., and greater if $V_{GS10}$ becomes greater than 15 volts during this period. In effect, $V_{DS10}$ will clamp to a voltage which is equal to the sum of the reverse breakdown voltage of diode 28 plus the forward drop of diode 32 plus $V_{GS10}$. The overvoltage protection circuitry consisting of diodes 28 and 32 is designated by dashed line 33.

The desaturation detection circuit (which includes diodes 28 and 32) is enabled only after transistor 10 has been sufficiently turned on. As transistor 10 approaches saturation, the OUT terminal of IC 12 drives the base of transistor 16 to $V_{DD}$ through resistor 18. The value of capacitor 36 is chosen to delay the enabling of the desaturation detection circuitry for approximately 10 µs, or until transistor 10 has gotten sufficiently close to saturation. Under normal saturation conditions, the drain terminal of transistor 10 is at approximately 2 volts. This causes diode 28 to be forward biased, pulling the voltage at the cathode of diode 34 down, thereby preventing diode 34 from conducting current in the reverse direction. If the drain terminal of transistor 10 does not drop below a certain value within 10 µs of turn-on, or transistor 10 comes out of saturation during normal operation, the voltage at the cathode of diode 34, a 7.5 volt zener, will ramp up, eventually reverse biasing diode 28 and shutting it off. When diode 34 reaches its zener voltage, it will break down and begin conducting in the reverse direction. The resulting voltage levels in the circuit can be determined from the voltage at the emitter of transistor 16, namely 14.3 volts. By subtracting 7.5 volts (the reverse breakdown voltage of diode 34) and 0.7 volts (the forward voltage drop of diode 20) from 14.3 volts, it can be determined that a total of 6.1 volts will be shared across resistors 40 and 24. If resistor 40 is 6.2 kΩ and resistor 24 is 1 kΩ, resistor 24 will have 0.83 volts developed across it, thus exceeding the 320 mV reference level and tripping comparator 44. Therefore, the actual desaturation sense trip point at the drain of transistor 10 is set by the reverse breakdown voltage of diode 34 (7.5 volts), plus the threshold voltage of comparator 44 (0.32 volts), less the forward voltage drop of diode 28 (about 0.8 volts), yielding a value of approximately 7 volts. Thus, any drain voltage greater than 7 volts will trip the de,saturation detection circuit.

Resistor 48 limits any damaging currents from flowing into the desaturation detection circuit whenever diode 28 breaks down during V++ bus or output load transients. The primary purpose of capacitor 26 is to provide noise filtering for the IM input of IC 12. When a desaturation condition occurs, capacitor 26 along with the parallel combination of resistors 24 and 40 determine both the response time of the desaturation detection circuit to a desaturation event, and the time it takes to reset the desaturation detection circuit once transistor 10 returns to normal operation. Where capacitor 26 is 1000 pF, resistor 24 is 1 kΩ, and resistor 40 is 6.2 kΩ, the reset delay (i.e., the time required to discharge capacitor 26 from 830 mV to 320 mV) turns out to be slightly less than 1 µs. The circuit's response time to a desaturation event (i.e., the time required to charge capacitor 26 from 0 to 320 mV) is slightly less. The turn-on delay of approximately 10 µs determined by the combination of resistor 18 and capacitor 36 only affects the desaturation delay during initial turn-on.

In one embodiment, IC 12 comprises a standard complementary metal oxide semiconductor (CMOS) integrated circuit.

While the invention has been particularly shown and described with reference to a specific embodiment thereof, it will be understood by those skilled in the art that the foregoing and other changes in the form and details may be made therein without departing from the spirit or scope of the invention.

What is claimed is:

1. An apparatus for suppressing voltage transients and for detecting desaturation conditions in power transistor systems, comprising:

a first transistor having a first terminal, a second terminal, a drive terminal, an avalanche breakdown voltage rating between the first and second terminals, the first terminal for coupling to a load, and the second terminal being coupled to ground;

a first diode having an anode and a cathode, the cathode of the first diode being coupled to the first terminal of the first transistor, the first diode having a reverse breakdown voltage which is less than the avalanche breakdown voltage rating;

a second diode having an anode and a cathode, the anode of the second diode being coupled to the anode of the first diode, and the cathode of the second diode being coupled to the drive terminal of the first transistor;

driver circuitry coupled to the drive terminal of the first transistor, the driver circuitry for providing a drive signal to the first transistor;

a first resistor;

a second transistor having a collector terminal, an emitter terminal, and a base terminal, the base terminal of the second transistor being coupled to the driver circuitry by means of the first resistor, the collector terminal for coupling to a power supply;

a first capacitor coupled between the base terminal of the second transistor and ground;

a third diode having an anode, a cathode, and a reverse breakdown voltage rating, the cathode of the third diode being coupled to the emitter of the second transistor, the cathode of the third diode also being coupled to the anodes of the first and second diodes, and the anode of the third diode being coupled to ground; and a comparator circuit coupled between the anode of the third diode and are reference voltage for sensing a desaturation condition of the first transistor.

2. The apparatus of claim 1 wherein the first diode has a reverse breakdown voltage of $0.9*V_B$, wherein $V_B$ is the avalanche breakdown voltage rating between the first and second terminals of the first transistor.

3. The apparatus of claim 1 wherein the first transistor is a power metal oxide semiconductor field effect transistor, the first terminal of the first transistor being a drain terminal, the second terminal of the first transistor being a source terminal, and the drive terminal of the first transistor being a gate terminal.

4. The apparatus of claim 1 wherein the first transistor is a power metal oxide semiconductor controlled thyristor, the first terminal of the first transistor being a drain terminal, the second terminal of the first transistor being a source terminal, and the drive terminal of the first transistor being a gate terminal.

5. The apparatus of claim 1 wherein the first transistor is an insulated gate bipolar power transistor, the first terminal of the first transistor being a collector terminal, the second terminal of the first transistor being an emitter terminal, and the drive terminal of the first transistor being a base terminal.

6. The apparatus of claim 1 wherein the first transistor is a bipolar power transistor, the first terminal of the first transistor being a collector terminal, the second terminal of the first transistor being an emitter terminal, and the drive terminal of the first transistor being a base terminal.

7. The apparatus of claim 1 wherein the driver circuitry and the comparator circuit are fabricated in an integrated circuit.

8. The apparatus of claim 7 wherein the integrated circuit comprises a standard complementary metal oxide semiconductor (CMOS) integrated circuit.

9. The apparatus of claim 1 wherein the first transistor and the first diode are fabricated on the same semiconductor substrate.

10. The apparatus of claim 1 wherein the first and third diodes comprise zener diodes.

11. An apparatus for suppressing voltage transients and for detecting desaturation conditions in power transistor systems, comprising:

a first transistor having a first terminal, a second terminal, a drive terminal, an avalanche breakdown voltage rating between the first and second terminals, the first terminal for coupling to a load, and the second terminal being coupled to ground;

a first diode having an anode and a cathode, the cathode of the first diode being coupled to the first terminal of the first transistor, the first diode having a reverse breakdown voltage which is less than the avalanche breakdown voltage rating;

a second diode having an anode and a cathode, the anode of the second diode being coupled to the anode of the first diode, and the cathode of the second diode being coupled to the drive terminal of the first transistor;

driver circuitry coupled to the drive terminal of the first transistor, the driver circuitry for providing a drive signal to the first transistor;

a first resistor;

a second transistor having a collector terminal, an emitter terminal, and a base terminal, the base terminal of the second transistor being coupled to the driver circuitry by means of the first resistor, the collector terminal for coupling to a power supply;

a first capacitor coupled between the base terminal of the second transistor and ground, the first resistor and the first capacitor forming a first RC network by which a delay in the enabling of the apparatus is determined;

a third diode having an anode and a cathode, the anode of the third diode being coupled to the emitter terminal of the second transistor;

a second resistor;

a third resistor;

a fourth resistor;

a fourth diode having an anode, a cathode, and a reverse breakdown voltage rating, the cathode of the fourth diode being coupled to the cathode of the third diode by means of the second resistor, the cathode of the fourth diode also being coupled to the anodes of the first and second diodes by means of the third resistor, and the anode of the fourth diode being coupled to ground by means of the fourth resistor;

a second capacitor coupled between the anode of the fourth diode and ground, the fourth resistor and the second capacitor forming part of a second RC network which determines the time in which the apparatus responds to a desaturation condition of the first transistor; and a comparator circuit coupled between the anode or the fourth diode and a reference voltage for sensing the desaturation condition.

12. The apparatus of claim 11 wherein the first diode has a reverse breakdown voltage of $0.9*V_B$, wherein $V_B$ is the avalanche breakdown voltage rating between the first and second terminals of the first transistor.

13. The apparatus of claim 11 wherein the first transistor is a power metal oxide semiconductor field effect transistor, the first terminal of the first transistor being a drain terminal, the second terminal of the first transistor being a source terminal, and the drive terminal of the first transistor being a gate terminal.

14. The apparatus of claim 11 wherein the first transistor is a power metal oxide semiconductor controlled thyristor, the first terminal of the first transistor being a drain terminal, the second terminal of the first transistor being a source terminal, and the drive terminal of the first transistor being a gate terminal.

15. The apparatus of claim 11 wherein the first transistor is an insulated gate bipolar power transistor, the first terminal of the first transistor being a collector terminal, the second terminal of the first transistor being an emitter terminal, and the drive terminal of the first transistor being a base terminal.

16. The apparatus of claim 11 wherein the first transistor is a bipolar power transistor, the first terminal of the first transistor being a collector terminal, the second terminal of the first transistor being an emitter terminal, and the drive terminal of the first transistor being a base terminal.

17. The apparatus of claim 11 wherein the driver circuitry and the comparator circuit are fabricated in an integrated circuit.

18. The apparatus of claim 17 wherein the integrated circuit comprises a standard complementary metal oxide semiconductor (CMOS) integrated circuit.

19. The apparatus of claim 11 wherein the first transistor and the first diode are fabricated on the same semiconductor substrate.

20. The apparatus of claim 11 wherein the first and fourth diodes comprise zener diodes.

21. An apparatus for suppressing voltage transients and for detecting desaturation conditions in a power transistor system employing a first transistor having a first terminal for coupling to a load, a second terminal for coupling to ground, a drive terminal, and an avalanche breakdown voltage rating, the apparatus comprising:

a first diode having an anode and a cathode, the cathode of the first diode being coupled to the first terminal of the first transistor, the first diode having a reverse breakdown voltage which is less than the avalanche breakdown voltage rating;

a second diode having an anode and a cathode, the anode of the second diode being coupled to the anode of the first diode, and the cathode of the second diode being coupled to the drive terminal of the first transistor;

driver circuitry coupled to the drive terminal of the first transistor, the driver circuitry for providing a drive signal to the first transistor;

a first resistor;

a second transistor having a collector terminal, an emitter terminal, and a base terminal, the base terminal of the second transistor being coupled to the driver circuitry by means of the first resistor the collector terminal for coupling to a power supply;

a first capacitor coupled between the base terminal of the second transistor and ground;

a third diode having an anode, a cathode, and a reverse breakdown voltage rating, the cathode of the third diode being coupled to the emitter of the second transistor, the cathode of the third diode also being coupled to the anodes of the first and second diodes, and the anode of the third diode being coupled to ground; and a comparator circuit coupled between the anode of the third diode and a reference voltage for sensing a desaturation condition of the first transistor.

22. The apparatus of claim 21 wherein the first diode has a reverse breakdown voltage of $0.9*V_B$, wherein $V_B$ is the avalanche breakdown voltage rating between the first and second terminals of the first transistor.

23. The apparatus of claim 21 wherein the driver circuitry and the comparator circuit are fabricated in an integrated circuit.

24. The apparatus of claim 23 wherein the integrated circuit comprises a standard complementary metal oxide semiconductor (CMOS) integrated circuit.

25. The apparatus of claim 21 wherein the first transistor and the first diode are fabricated on the same semiconductor substrate.

26. The apparatus of claim 21 wherein the first and third diodes comprise zener diodes.

\* \* \* \* \*